(12) United States Patent
Wade et al.

(10) Patent No.: US 9,668,032 B2
(45) Date of Patent: May 30, 2017

(54) APPARATUS, SYSTEM AND METHOD FOR A CLOUD BASED UNIVERSAL FLEET MONITORING SYSTEM

(71) Applicant: NergySense, LLC, Charlottesville, VA (US)

(72) Inventors: James R Wade, Barboursville, VA (US); Robert William Mosolgo, Charlottesville, VA (US)

(73) Assignee: NergySense, LLC, Charlottesville, VA (US)

( * ) Notice: Subject to any disclaimer, the term of this patent is extended or adjusted under 35 U.S.C. 154(b) by 422 days.

(21) Appl. No.: 14/280,533

(22) Filed: May 16, 2014

(65) Prior Publication Data

US 2015/0046106 A1 Feb. 12, 2015

Related U.S. Application Data

(60) Provisional application No. 61/824,252, filed on May 16, 2013.

(51) Int. Cl.
*G01R 31/36* (2006.01)
*H04Q 3/00* (2006.01)

(52) U.S. Cl.
CPC .......... *H04Q 3/00* (2013.01); *G01R 31/3689* (2013.01)

(58) Field of Classification Search
CPC .............................. H04Q 3/00; G01R 31/3689
USPC .................... 702/63; 455/406, 567; 324/426; 713/300, 320, 340
See application file for complete search history.

(56) References Cited

U.S. PATENT DOCUMENTS

| | | | | |
|---|---|---|---|---|
| 7,791,312 B2* | 9/2010 | Kook | .................... | H02J 7/0044 320/108 |
| 8,639,214 B1* | 1/2014 | Fujisaki | .................. | G06Q 20/32 379/88.03 |
| 8,676,273 B1* | 3/2014 | Fujisaki | ............... | H04M 1/6505 379/142.06 |
| 9,015,513 B2* | 4/2015 | Murawski | ......... | H04W 52/0261 713/300 |
| 9,316,694 B2* | 4/2016 | Campbell | .......... | G01R 31/3606 |
| 9,448,543 B2* | 9/2016 | Narendra | .................. | G05B 1/03 |
| 2014/0225620 A1* | 8/2014 | Campbell | ............ | B60L 11/1838 324/426 |
| 2014/0229129 A1* | 8/2014 | Campbell | .......... | G01R 31/3606 702/63 |

* cited by examiner

*Primary Examiner* — Carol S Tsai
(74) *Attorney, Agent, or Firm* — Symbus Law Group, LLC; Clifford D. Hyra

(57) ABSTRACT

An enhanced system and method for monitoring operation of a plurality of data sensors allows monitoring of data from industrial batteries and/or Battery Data Sensors (BDSs), vehicles, charging systems and related equipment. One or more Data Collection Modules communicate wirelessly and receive data from each device sensor, store data in the Data Collector memory and asynchronously transmit the data through the Cloud and/or Internet to the Cloud Server, which stores and process all received raw data and stores configuration information for each uniquely identified monitored device. Users may interact with the monitoring system using smart Web-enabled devices, and may submit user configuration data via the Cloud Server and receive reports regarding operation of the monitoring system, individual sensors and monitored devices.

19 Claims, 3 Drawing Sheets

APPARATUS, SYSTEM AND METHOD FOR A CLOUD BASED UNIVERSAL FLEET MONITORING SYSTEM

PRIORITY

This application claims the benefit of U.S. Provisional Application No. 61/824,252, filed May 16, 2013, which is hereby incorporated by reference in its entirety.

FIELD OF THE DISCLOSURE

Embodiments of the present invention pertain generally to a system and method for monitoring data from industrial batteries or Battery Data Sensors (BDSs), vehicles, charging systems and related equipment, and in particular to a system and method for the remote, asynchronous and long term monitoring, management and operation of industrial and other batteries, vehicles, charging systems and related equipment data

BACKGROUND

Application of motive power batteries to industrial vehicles requires integration of the vehicles, batteries and charging systems. Proper monitoring of all components is necessary in order to insure continued operation of the vehicle, optimize its operation and schedule proper maintenance and repair when needed, thereby maintaining optimal performance level, reducing down time and avoiding costly repairs with replacement of the components that are likely to break or degrade performance.

Conventional batteries, chargers and vehicles, and related equipment lack centralized monitoring capabilities. To the extent that monitoring capabilities exist, they are merely local to a given unit, i.e., they operate only in isolation with respect to the given unit. Typically, a given unit will have no capability for monitoring and collecting data from and about its (namely, the unit's) performance. Failure to monitor and maintain these components, however, will result in reduced efficiency or in failure of the vehicle or unit.

In most conventional systems, the battery, vehicle and charger are monitored independently. In many cases, the same variable data is recorded in different systems or combinations.

Typical Industry Monitoring

Many suppliers of industrial batteries, chargers and vehicles offer specific monitoring instruments, or include some form of monitoring in their products. Such instruments and/or monitoring are more common on higher cost or more sophisticated products. The majority of conventional industrial electric vehicles and peripheral equipment do not have these capabilities.

In the conventional systems, monitoring typically requires and depends on the sophisticated hardware that is installed on the battery itself or peripheral equipment connected to the battery. The hardware is designed to be intimately familiar with the equipment and the environment that it is monitoring and stores long term data directly in some memory that is on the device or peripheral equipment connected to the device.

For the majority of the industrial vehicle components that have no monitoring instrumentation and capabilities, the burden of maintaining performance falls squarely on the user, and requires the user to undertake, collect, record and evaluate manual measurements of the equipment in use. This is often not properly or is erroneously recorded by the user or the measurements are incorrectly performed, resulting in lowered fleet efficiency for an extended period of time and financial losses due to inefficient operations, added repair costs and losses due to malfunction and inactivity.

To update and/or upgrade conventional industrial vehicles and batteries requires the user to actually visit the site and manually upgrade the monitoring or other hardware and/or software components.

SUMMARY

It is to be understood that both the following summary and the detailed description are exemplary and explanatory and are intended to provide further explanation of the present invention as claimed. Neither the summary nor the description that follows is intended to define or limit the scope of the present invention to the particular features mentioned in the summary or in the description. Rather, the scope of the present invention is defined by the appended claims.

In certain embodiments, the disclosed embodiments may include one or more of the features described herein.

In order to address one or more of the above-mentioned problems with the current systems and further achieve additional benefits and efficiencies, an aspect of the present invention is to provide a universal cloud-based monitoring utility for industrial electric vehicle fleets, batteries and related components.

Another aspect of the present invention is to provide a simple, configuration-free battery sensor installed on the battery. Alternatively one or more sensors, including Identity Sensors, for the battery may be mounted on peripheral equipment, including the truck and the charger. The Battery Sensor may record the electrical characteristics of the battery, and may also record the unique ID of any connected Identity Sensors. This data may be recorded in an abstract format, not requiring the user or operator to have any specific knowledge of the battery or peripherals to which it is attached.

It is a further aspect of the present invention to be able to periodically collect and store, among others, such BDS operational parameters as Battery Current, Battery Voltage, Mid cell Battery Voltage (for cell Voltage balance determination), Battery Temperature, Electrolyte Level and other Configuration, Summary Data and Event Data.

It is another aspect of the present invention to provide a separate Data Collector module(s) (or "Data Collector(s))", which communicates using a wireless communications network to one or more Battery Sensors. The Data Collectors may read the data from the Battery Sensor and forward it to the Cloud Server, via any network, including, without limitation, a Wide Area Network, Local Area Network or any system or network that is connected to the Internet.

It is yet another aspect of the present invention to allow the Data Collector to confirm that data is received, provides the confirmation information to the Battery Sensor and assure the integrity of the collected and transferred data. The Battery Sensor may report this to the user via a set of status LEDs or a communication message confirming the receipt of the data and verification of the data integrity.

Yet another aspect of the present invention is to provide a Cloud Server, receiving data from one or more Data Collector(s) for analysis, storage and processing of all Battery Sensor data. As the Battery Sensor has recorded the unique ID of any Identity sensor providing data at the time of measurement, the raw data tables also have all data relating to a particular peripheral device. In addition, the present system may assign a Time Stamp each time it collects or receives data from the Identity sensor of each Battery Sensor. Alternatively, the unique ID may be incorporated into the time stamp itself, thereby uniquely identifying the sensor and the time when the data was collected from the sensor.

In accordance with another aspect of the present invention, the Cloud Server may also maintain Configuration data for all sensors. As the configuration data and raw sensor data are separate, the configuration may be entered at any time, and is not required prior to the Battery Sensor recording data. Once both raw data and a configuration for the sensor are received and exist on the Cloud Server for a particular sensor, the Cloud Server can generate, process (using one or more processors) and store Application data. The Application data is used by the reporting and event modules to generate actionable data for the user.

The event module evaluates the application data to identify exceptional conditions. The reporting module evaluates the application data to produce a variety of management reports. In both cases, the data can be retrieved by Battery Sensor ID, by Identity Sensor ID, or for a group of these. A user management module on the Cloud Server may manage access to Application and Configuration data. The event module may deliver information to authorized users using text messaging, as emails, wireless signals to applications on the mobile device or other delivery methods. Authorized users may access Application, Configuration and Battery Sensor data using a Web-access enabled and Internet-connected device, such as a tablet, smart phone, laptop or desktop PC.

These and other beneficial features and advantages of the present invention are disclosed in detail hereinafter with reference to the accompanying drawings and descriptive matter in each embodiment of the present invention.

In one aspect of the present technology, there is provided a battery sensor for attachment to and monitoring of any given one amongst a first population of interchangeable batteries, each battery being selectively connectable to any given one amongst a second population of interchangeable external devices. Such a system includes: a memory to store at least an ID of the battery monitor; one or more monitors configured to sense values of operational parameters of the given battery, respectively; a first interface configured to receive an ID from and of the given external device to which the given battery is connected; and a second interface configured to communicate, at least indirectly with the host over a communication path for which at least one segment thereof is a wireless segment, at least the sensed parameter values, the battery monitor ID and the external device ID to a remote host.

In another aspect of the present technology, there is provided system for monitoring a first population of interchangeable batteries. Such a system includes: a computational host remote from the first population of batteries; a second population of battery sensors, attachable to the first population of batteries and configured to monitor the same, respectively, each sensor including: a first interface configured to communicate at least indirectly with the host over a communication path for which at least one segment thereof is a wireless segment; the host including a second interface to communicate at least indirectly with the battery sensors; the host being configured to receive, via the second interface, communications from the battery sensors, wherein a given communication from a given battery sensor includes an ID of the given battery and sensed values of operational parameters of the given battery; and the host being configured to quantitatively assess behavior as a whole of the first population of batteries based on the sensed values of the operational parameters and the IDs of the batteries corresponding thereto, respectively.

In another aspect of the present technology, there is provided another system for monitoring a first population of interchangeable batteries. Such a system includes: a computational host remote from the first population of batteries; a second population of battery sensors, attachable to the first population of batteries and configured to monitor the same, respectively; a third population of interchangeable devices external to the batteries, any given device amongst the third population being selectively connectable to any given one of the batteries; each sensor including a first interface configured: to communicate with the host at least indirectly over a communication path for which at least one segment thereof is a wireless segment; and to receive an ID from and of the given external device to which the given battery is connected; the host including a second interface to communicate at least indirectly with the batteries; the host being configured to receive, via the second interface, communications from the battery sensors, wherein a given communication from a given battery sensor includes an ID of the given battery, sensed values of operational parameters of the given battery, and the ID of the given external device and the ID of the given external device; and the host being further configured to generate adaptive data for the given external device based on the sensed parameter values and relations thereof with the given battery monitor ID and the given external device ID, respectively, and communicate the same to the given external device.

These and further and other objects and features of the present invention are apparent in the disclosure, which includes the above and ongoing written specification, with the drawings.

BRIEF DESCRIPTION OF THE DRAWINGS

The accompanying drawings, which are incorporated herein and form a part of the specification, illustrate exemplary embodiments and, together with the description, further serve to enable a person skilled in the pertinent art to make and use these embodiments and others that will be apparent to those skilled in the art. Embodiments of the present invention will be more particularly described in conjunction with the following drawings wherein.

DETAILED DESCRIPTION

Figure 1:
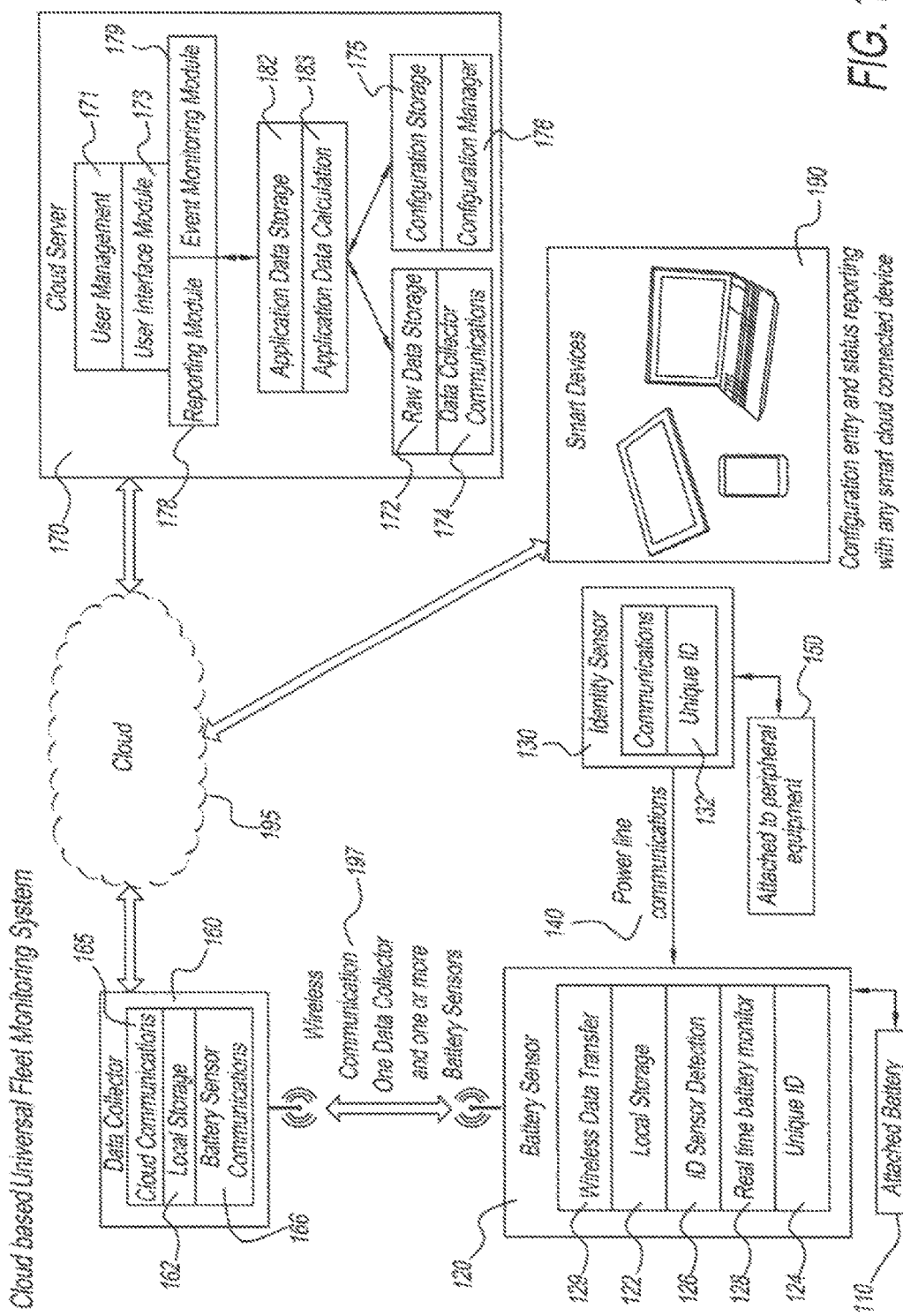
FIG. 1 illustrates a schematic diagram of a system architecture and a computer network of a Cloud Based Universal Fleet Monitoring system and method in accordance with an embodiment of the present invention.

Embodiments of a cloud-based universal battery fleet monitoring system will now be disclosed in terms of various exemplary embodiments. This specification discloses one or more embodiments that incorporate features of the present invention. The embodiment(s) described, and references in the specification to "one embodiment", "an embodiment", "an example embodiment", etc., indicate that the embodiment(s) described may include a particular feature, structure, or characteristic. Such phrases are not necessarily referring to the same embodiment. When a particular feature, structure, or characteristic is described in connection with an embodiment, persons skilled in the art may effect such feature, structure, or characteristic in connection with other embodiments whether or not explicitly described.

In the several figures, like reference numerals may be used for like elements having like functions even in different drawings. The embodiments described, and their detailed construction and elements, are merely provided to assist in a comprehensive understanding of the present invention. Thus, it is apparent that the present invention can be carried out in a variety of ways, and does not require any of the specific features described herein. Also, well-known functions or constructions are not described in detail since they would obscure the present invention with unnecessary detail.

The description is not to be taken in a limiting sense, but is made merely for the purpose of illustrating the general principles of the present invention, since the scope of the present invention is best defined by the appended claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items. As used herein, the singular forms "a", "an" and "the" are intended to include the plural forms as well, unless the context clearly indicates otherwise.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Again, as noted in the Background section, conventional batteries, chargers and vehicles, and related equipment lack centralized monitoring capabilities. To the extent that monitoring capabilities exist, they are merely local to a given unit, i.e., they operate only in isolation with respect to the given unit. Typically, a given unit will have no capability for monitoring and collecting data from and about its (namely, the unit's) performance. Failure to monitor and maintain these components, however, will result in reduced efficiency or in failure of the vehicle or unit. In the course of developing embodiments of the present invention, the inventors made the following related observations. This lack of centralized data collection and performance monitoring capabilities for a fleet of units results in highly inefficient, complex and economically costly procedures for maintaining fleet performance and conducting repairs. Data and performance from each unit has to be examined individually, resulting in a highly inefficient analytical and maintenance approach. For devices and fleets for which no effective monitoring tools exist, periodic manual inspections and analysis of the actual units are required to maintain the fleet operation. This is also a highly inefficient approach to fleet maintenance and repair, particularly when the fleet consists of units that are put into operation at different times and/or are operated at different frequency or capacity. Avoiding such failures through efficient and effective monitoring of a fleet of multiple units is important.

Again, as noted in the Background section, in most conventional systems, the battery, vehicle and charger are monitored independently. In many cases, the same variable data is recorded in different systems or combinations. In the course of developing embodiments of the present invention, the inventors made the following related observations. Because batteries and chargers may be used interchangeably with a vehicle, it is difficult (if not impossible) in the conventional systems to fully identify the specific charger/battery/vehicle combination in use at any specific time. Therefore, without being able to specifically identify the combination used, problems that reduce fleet efficiency cannot be fully tracked, monitored and predicted. While it may be identified (using an independent monitoring system) that a problem is occurring with the charging system, it may not be possible to identify the specific faulty charger without significant additional work, including extensive expenditures of time and cost and involving inspection analysis of each component separately. Overall fleet performance can be improved when monitoring and data collection can be performed for each unit, component or combination, and the data can be stored and analyzed to identify best practice methods, and identify underperforming or defective components.

Again, as noted in the Background section, in the conventional systems, monitoring typically requires and depends on the sophisticated hardware that is installed on the battery itself or peripheral equipment connected to the battery. The hardware is designed to be intimately familiar with the equipment and the environment that it is monitoring and stores long term data directly in some memory that is on the device or peripheral equipment connected to the device. In the course of developing embodiments of the present invention, the inventors made the following related observations. Operationally, this places a burden on the user, by requiring each user or person monitoring operation of the battery to fully understand the monitoring device, monitored parameters, and environment and to provide and evaluate detailed configuration information. Often this information is either not available, or may be entered incorrectly, resulting in faulty or erroneous data that is collected from the device or entered. In addition, the integrity of the collected data is also at risk due to failures or damage to the monitoring device. Without additional management, the collected data, which is monitored and evaluated, and used to ensure battery fleets' health, maintenance and repair scheduling and optimal operation, may be irretrievably lost.

In the course of developing embodiments of the present invention, the inventors made the following related observations. There is a need for a low-cost system that allows monitoring and collection of data from each vehicle or battery in the fleet, without expensive on-board hardware, software and memory. There is also a need for a system that allows collection of the data from multiple units and transmission of this data without the need for a user to manually read and process the data at the site. Furthermore, there is a need for a system that receives input from multiple units and components and is able to identify and store data for each unit, uniquely identifying it and allowing remote analysis of the collected data for individual units, components and the overall fleet.

Again, as noted in the Background section, to update and/or upgrade conventional industrial vehicles and batteries requires the user to actually visit the site and manually upgrade the monitoring or other hardware and/or software components. In the course of developing embodiments of the present invention, the inventors made the following related observations. This also creates additional burdens and costs for the user or operator and discourages upgrades and improvements to the existing fleet and industrial vehicles. Accordingly, there is a need for a system that allows upgrades and updates to the system and monitoring, with minimal requirements for manual operations and user presence at the actual site or location of each monitored unit.

FIG. 1 illustrates a schematic diagram of a system architecture and a computer network for a Cloud Based Universal Fleet Monitoring system and method in accordance with an embodiment of the present invention.

A system and method for the Cloud Based Universal Fleet Monitoring system and method in accordance with at least one embodiment of the present invention comprises one or more of the following components, namely a plurality (population) of Batteries 110, Battery Sensor(s) 120, Data Collector(s) 160, Cloud Server(s) 170, Peripheral equipment (devices) 150 (e.g., a population of vehicles on which Batteries 110 are installed, a population of chargers being used to charge Batteries 110, etc.) and (optionally) Smart Mobile Device(s) 190. For example, at least some if not all of the Batteries 110 are interchangeable. The at least one embodiment communicates data amongst such components which includes, among other things, unique identifiers of each instance of Battery Sensor 120, Peripheral equipment 150 and (optionally) Data Collector 160. A benefit of using the unique identifiers (as will become clear from the discussion following below) is that the at least one embodiment is not restricted to using batteries of a predetermined type/brand/model, Battery Sensors 120 of a predetermined type/brand/model, nor Peripheral equipment (devices) 150 (e.g., vehicle, charger, etc.) of a predetermined type/brand/model. Accordingly, the at least one embodiment can be described as type/brand/model-agnostic or, in other words, as universal.

Battery Sensor

Referring to FIG. 1, at least one Battery Sensor 120 may be mounted on a Battery 110, or another device that is monitored. Alternatively, it may be mounted on auxiliary equipment that is attached to a Battery or related equipment. The Battery Sensor 120 collects data and uniquely identifies the Battery or another monitored device to which it is attached. Among other things, the Battery Sensor 120 may also comprise or be part of a component that also comprises an ID Sensor Detection module 126, Real Time Battery Monitor 128 and Wireless Data Transfer module 129, Local Storage or Cache Memory 122 and Unique Id 124 for the Battery 110. Battery 110 may be, e.g., a motive power battery. For example, a motive power battery may be a cycle service battery configured to provide/source voltage and current at levels/magnitudes required by industrial vehicles for which at least one electric motor is the prime mover/motor thereof. Cycle service is a type of battery operation/use that repeatedly (if not substantially continuously) subjects a given battery to successive instances of a service-cycle in which the given battery is charged and then discharged. A Battery Sensor 120 may be attached to each Battery 110 in the facility. Optionally, at least one Identity Sensor 130 may be attached to Battery Peripheral Equipment 150, such as a vehicle (a charge sink) and the charger (a charge source). For example, the vehicle can be an electrically powered industrial vehicle, e.g., a truck, a forklift, etc. As indicated in FIG. 1, the Identity Sensor 130 may communicate with and be attached to the Battery Sensor 120 via Battery Power Line 140, such as a cable and/or other electrical conductor that can support data communications. For example, where Peripheral device 150 is a charger, then such data communications can take place over/through the same cable and/or other electrical conductor (conduction path) over/through which Battery 110 is charged by charger 150. Also for example, where Peripheral device 150 is a vehicle (e.g., a forklift), then such data communications can take place over/through the same cable and/or other electrical conductor (conduction path) over/through which Battery 110 supplies voltage and current to forklift 150.

The Identity Sensor 130 may include, identify, store and/or transmit a Unique ID 132, which uniquely identifies the sensor, and by extension the attached Peripheral equipment 150, and a Communications Module 134, which delivers the Unique ID 132 via the Battery Power Line 140 to the attached Battery Sensor 120. The Battery Sensor 120 includes a Unique ID 124 of the Battery Sensor, which uniquely identifies the battery sensor in the monitoring system. A Real Time Battery Monitor 128 measures the electrical characteristics of the battery. The ID Sensor Detection module 126 detects and records the Unique ID 132 from the Identity Sensor 130, preferably attached via the Battery Power Line 140.

Local Storage or local Cache Memory 122 is used to maintain a short term record of the data recorded by the Real Time Battery Monitor Module 128, combined with the values and data received by the ID Sensor Detection module 126. Combined, the real time battery or device specific data and ID Sensor data provide a detailed record of usage and activity for the battery or other monitored device and the peripheral equipment. The Wireless Data Transfer module 129 may communicate with the Data Collector 160 via a wireless network, which may include 900 Mhz proprietary systems, 802.11 WiFi systems or other networks. The Wireless Data Transfer module 129 may utilize a wireless transceiver for communicating with the Data Collector 160 using a specific or particular proprietary communication protocol. The Wireless Communications 197 between the Battery Sensor 120 and Data Collector 160 may utilize WiFi, Blue Tooth, IR, or other similar wireless communications and/or may communicate via Internet, and/or may also utilize satellite communications for mobile wireless devices that are part of this network. Data stored in the Local Storage or local Cache Memory 122 is delivered to the Data Collector 160 on request, and the local storage may be cleared or reset once it is confirmed that the data transfer was successfully concluded and/or received at the intended destination. In some embodiments in accordance with the present invention, the Local Storage or local Cache Memory 122 is cleared on command received from the Data Collector 160. In some embodiments, the Local Storage or local Cache Memory 122 may store data locally for at least two week period before it is cleared.

Data Collector

The Data Collector 160 communicates with one or more Battery Sensors 120 and passes the battery sensor data to a remote host, e.g., the Cloud Server 170, via a Cloud 195, which may comprise any communication network, including without limitation, a Wide Area Network (WAN) connection, Local Area Network (LAN), the Internet and/or additional cellular or satellite communication networks, receivers, gateways or hubs. The Battery Sensor Communications module 166 communicates with one or more Battery Sensors 120, collecting data from each sensor, and confirming and/or verifying to the sensor that data was transmitted and received at the intended destination, and that the Battery Sensor 120 data is no longer required to be stored in the sensor's Local Storage or local Cache Memory 122. Local Storage or Collector Memory 162 on the Data Collector 160 stores the sensor-related data that is received by the Data Collector 160 from each Battery Sensor 120. A Unique ID stored in the Data Collector 160 may identify the Data Collector 160 within the monitoring system. Cloud Communications module 165 of the Data Collector 160 communicates with the Cloud Server 170, and delivers to the Cloud Server data received from one or more Battery Sensors 120, which includes data from the Local Storage or local Cache Memory 122 of each Battery Sensor 120 plus the Unique Data Collector ID for the Data Collector 160, identifying the Data Collector 160 to the monitoring system and to Cloud Server 170. Upon receiving confirmation of the receipt of the transmitted data from the Cloud Server 170, the Data Collector 160 delivers a confirmation message back to each Battery Sensor 120, confirming the receipt of the data from the Battery Sensor 120 at the Cloud Server 170. The confirmation may be done by utilizing a "check sum" of the transmitted data or other known methods for confirming full transmission and receipt of the data, without losses.

In at least one embodiment of the present monitoring system, the Data Collector 160 requires no configuration. Once it is powered on, it automatically communicates with the Cloud Server 170, and also periodically and automatically looks for wireless communication with a Battery Sensor(s) 120 that is in range. If there is a power loss or a reset of the Data Collector 160 or the overall system, the Data Collector 160 will automatically restart and re-establish the connection with the Cloud Server 170 and the Battery Sensor(s) in range for communications.

In another embodiment of the present monitoring system, the Data Collector 160 may include certain local troubleshooting capability. It may also be capable of connecting locally to the Internet via a web browser, and of monitoring and analyzing the activity of the battery sensor network.

Cloud Server

The Cloud Server 170 may comprise at least one computer processor and memory (internal and/or external) to collect, store, process and analyze regarding the population of Batteries 110 monitored by the monitoring system. The Data Collector Communications module 174 of the Cloud Server 170 receives data from multiple Data Collectors 160 and reports storage statistics in response. The Cloud Server 170 may also comprise a Raw Data Storage module 172, which stores all Battery 110, Battery Sensor 120, Identity Sensor 130 and Data Collector 160 data in the format that it is received. The Cloud Server may store the data in the internal or external memory, and preferably utilize one or more databases for storing Raw Data and other received data from each Data Collector. It may also comprise a Configuration Manager module 176, which accepts user input and defines the Battery 110 and external (relative to the Battery 110) Peripheral equipment (devices) 150 associated with each Battery Sensor 120 and Identity Sensor 130 in the system. This information may typically include the type, capacity and electrical characteristics of the battery, the type and capacity of a charger, and the type and capabilities of the vehicle (the system may have any number of each component). Additional information may also be recorded, including the age and previous usage of the equipment, service and support data and any other information necessary to monitor the equipment. The Configuration Storage module or memory 175 on the Cloud Server 170 may store all configuration data for each Battery Sensor 120 and Identity Sensor 130. When Raw data and Configuration data exist in the Cloud Server 170 for the same unique ID, additional tasks may be performed on the Cloud Server, to process and/or combine the data for the same uniquely identified device.

The Cloud Server 170 may also comprise an Application Data Calculation module 183, which takes configuration parameters and applies them to raw data, producing application specific data used in the remainder of the system. The Application Data Calculation module 183 may be executed at any time, meaning that errors in the Configuration data do not permanently impact the system. The Application Data Calculations may be re-run or re-executed with corrected configuration data, producing accurate application data. The Application Data Storage or memory 182 on the Cloud Server 170 may store the results of the Application Data Calculations and provides a long-term record of the fleet/population performance, e.g., including: average daily, weekly, monthly and/or yearly usage/charge; and/or average daily, weekly, monthly and/or yearly temperature; overall throughput; etc.

When Application Data is available, the Reporting module 178 on the Cloud Server 170 can generate reports on fleet/population performance and activity. As all data are tagged with unique IDs from the sensors, the Reporting module 178 can analyze performance across the fleet and produce metrics that are valuable for enhancing performance, improvements to the system and for updates and scheduling of maintenance and/or repair. The Event Monitoring module 179 may be executed on a scheduled basis, and identify out-of-range data. Both the Event and Reporting modules 178 and 179 are managed by information from the user, recorded in the Configuration Storage module or memory 175.

The Cloud Server 170 may also comprise a User Interface Module 173, which delivers fleet information to authorized users. Information may include reports, events and operational information. Data may be pushed via text alerts, email or social network feeds, or it may be requested by the user from the Cloud Server 170. In all cases the information delivered is based on the cloud server data, and the user's unique configuration data. The User Management module 171 on the Cloud Sever 170 may define the security and access available to specific users. Users will receive access only to sensor and application data for their own applications, excluding other customer or system data.

Smart Mobile Devices

The users of the present monitoring system and method may interact with the Fleet Monitoring System using smart Web enabled devices 190, such as smart phones, tablets and laptop computers. Users may log in to a web interface to provide configuration and other data directly to the cloud server and generate reports and view other information, and/or may access data collectors 160 via a web interface to view data collector information and/or raw sensor data directly. All user configuration data is entered via the Cloud Server 170, and no direct communications with, or configuration of the batteries and Identity Sensors are required. If a Battery Sensor 120 and Data Collector 160 are present, and the Data Collector 160 can access and communicate with the Cloud Server 170, all raw data, collected by the Data Collector 160 for one or more Battery Sensor(s) 120 will be recorded automatically. Furthermore, because the recording is done periodically, for each Battery Sensor, the local memory on the sensor may be reset or erased once it is confirmed by the Could Server 170 that the delivered data was received and stored.

In some embodiments, data collectors may not be used for some or all battery sensors, and some or all battery sensors may be configured for direct communication with the cloud server. Adding direct cloud server communication capability to battery sensors may make them too expensive, large, and/or difficult/expensive to maintain for some applications. However, such capability may be desirable for certain applications, such as where there are only a few battery sensors but they are geographically remote. The desirability of such capabilities may increase over time as technology improves.

Figure 2:
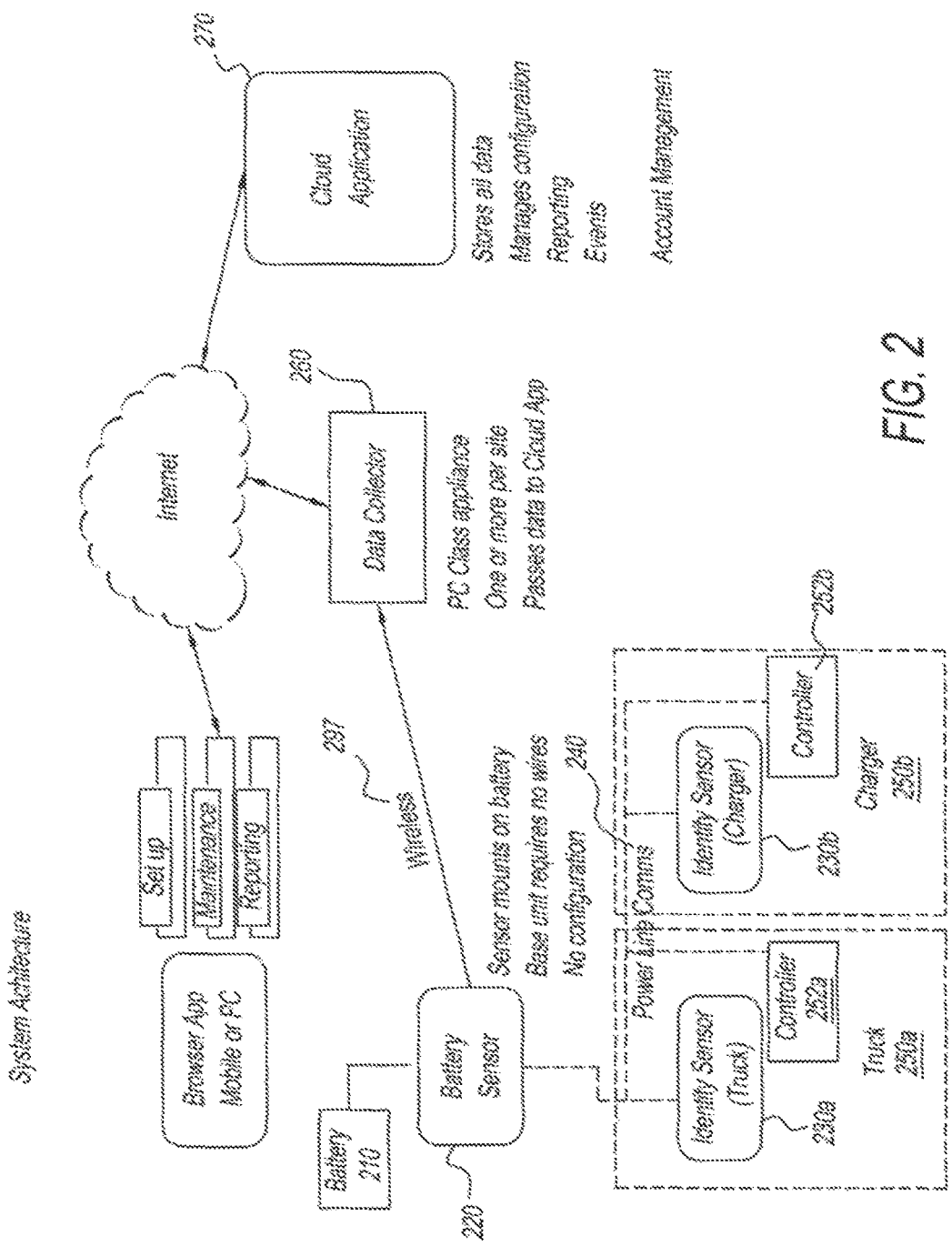
FIG. 2. illustrates a simplified schematic diagram of a system architecture and a computer network of another Cloud Based Universal Fleet Monitoring system and method in accordance with an embodiment of the present invention.

FIG. 2. illustrates a simplified schematic diagram of a system architecture and a computer network of another Cloud Based Universal Fleet Monitoring system and method in accordance with an embodiment of the present invention.

In FIG. 2, the Battery Sensor 220 may be a low cost monitoring device, designed to work on a wide range of motive power batteries and other similar power equipment. In accordance with at least one embodiment, included in or with the sensor is a variety of inputs and output LEDs, plus a Wireless Communication Network module 297 and a Power Line 240. The inputs to the Battery Sensor 220 are used to monitor the battery, preferably recording the temperature, current voltage and electrolyte level of the monitored battery or other equipment. The Wireless Network interface or module 297 is used for communications with the Data Collector 260. The communications between the Battery Sensor 220 and the Data Collector 260 may be performed using a proprietary or other wireless communications protocol.

The Power Line 240 may be utilized to connect the Battery Sensor 220 to other sensors attached to Battery 210, truck 250A and/or charger 250B. These additional sensors may be used to extend the base battery sensor functionality, including identification of the specific truck 250B and/or charger 250B to which the monitored battery 210 is connected. The Power Line 240 may also be used to provide data to and/or from a controller 252B of charger 250B and/or a controller 252A of truck 250A. Thereby, for example, software updates can be provided to controller 252B of charger 250B and/or a controller 252A of truck 250A. Also thereby, for example, adaptive configuration data can be provided to controller 252B of charger 250B and/or a controller 252A of truck 250A in order to facilitate adaptive (if not optimized) charging or truck management functionality, respectively. The Battery Sensor 220 is constructed to be able to accurately record all input data, and may also include local Cache Memory or some other memory that can store obtained input data, for transmittal to the Data Collector 260. The following sections describe some of the requirements for the data and its storage, in accordance with at least one embodiment of the present invention.

Data Content

The Battery Sensor data stored in the local Cache Memory of the Battery Sensor 220 may include the following items:

| Element | Description |
| --- | --- |
| Sensor ID | Uniquely identifies the sensor. Must be unique amongst the entire universe of sensors |
| PL Sensor ID | Identifies the sensor connected via Power Line comms, if any. NOTE: This is for sensors on equipment to which the battery is connected. If this element is present, then the connected sensor does not communicate directly to the Data Collector. Instead it is an 'Identity sensor' which simply identifies the asset to which it is attached. |

-continued

| Element | Description |
| --- | --- |
| Time | Identifies the time sample was collected |
| Voltage | Average, median or other voltage reading over the sample period |
| Current | Total current in/out |
| Ambient Temperature | Average, median or other temperature reading over the time interval |
| Battery Temperature | Average, median or other temperature reading over the time interval, if sensor is equipped with a temperature probe |
| Electrolyte Level | Low/OK level. |

Data Requirements

The Battery Sensor 220 may be able to collect its data from the Battery and/or the Identity Sensor(s) without a requirement for a battery-specific configuration. The collected data is then sent to the Data Collector 260 in an abstract form, and configuration information may be applied in the cloud to translate the abstract battery data into battery-specific user information. The transmitted data may be sampled on a fixed frequency basis. A sample reports battery condition over the time period that is sampled. Sample rate may be configurable, for example from 1 to 60 seconds, but other intervals are also possible and are covered within the scope of the present invention.

Local Data Storage (Battery Sensor)

The Battery Sensor 220 may also comprise memory, preferably local cache memory, that is capable of storing data locally for a reasonable time period. Preferably, data may be stored for at least two weeks. The local storage capability allows for continuous data collection when communications between the Battery Sensor 220 and Data Collector 260 is lost for some period of time. The local Cache Memory or Data Storage are 222 (not shown in FIG. 2; shown as 122 on FIG. 1) of the Battery Sensor 220 can be cleared or reset on a command received from the Data Collector 260, once it establishes and confirms that the data was property received from the Battery Sensor 220, and then transmitted to, stored and processed by the Cloud Server (or Cloud Application) 270.

Data Collector Communications

The Battery Sensor hardware may preferably include a wireless transceiver as part of the Wireless Communication Network module 297. The transceiver is used to communicate with a Data Collector 260 using a proprietary protocol. The communications protocol may preferably support and comprise at least the following functions:

| Function | Description |
| --- | --- |
| Connect | Establish a communications link between the DC and the Battery Sensor. |
| Read Data | Transfer data from sensor to Data Collector. |
| Confirm Data | Data Collector tells Battery Sensor that data is received and transferred to Cloud Server. This also indicates that Battery Sensor may erase locally stored data. |
| Program Sensor | Data Collector can send firmware updates to Battery Sensor via the wireless network. |
| Clock set | Battery Sensor time clock is synced to Data Collector time clock |
| Status | Data Collector sends status message to Battery Sensor, which can be used to control output LEDs on the Battery Sensor or connected equipment. |

Power Line Communications

In FIG. 2A, a power Line 240 may be used by the Battery Sensor 220 to communicate with other sensors operating on the same DC power line, e.g., vehicle-ID sensor 230A provided on vehicle (e.g., truck, forklift, etc.), charger-ID sensor 230B provided on charger 230B. Typically, these may be Identity Sensors 230A and 230B, which provide identity tokens, respectively, for inclusion in the sample to be sent to the Data Collector and cloud. As shown in FIG. 2, the Identity Sensors 230A and 230B may indentify at least one truck and/or at least one charger, respectively, connected to the Battery Sensor 220.

The Battery Sensor 220 may send a request, and when the Identity Sensor(s) 230A and 230B see the request, each replies with its own unique ID, uniquely identifying the connected device or equipment. This unique ID is be recorded in the sampled data and passed to the Data Collector 260 via Wireless Communication Network 270 to the Cloud Server 270. The Cloud Server may then utilize the unique ID and the cloud based configuration data to identify the device or equipment (asset) on or to which the identity token is mounted or connected.

In some embodiments of the present invention, the Battery Sensor may further interface with any of various existing networks. For example, some truck fleets have networks that allow the trucks to communicate to a central location which operators are driving the trucks, at what times, etc. So the trucks already have transponders and, for example, a keypad and monitor for operators to input their credentials. The Battery Sensor for a truck battery may interface directly with this existing network to make use of the transponders and/or information available on the network, and/or to send information over the network to, for example, the central location. The truck network may make use of information from the Battery Sensors to improve truck performance, reduce down time and decrease maintenance costs.

Similarly, intelligent battery chargers may for example be networked (e.g. using Bluetooth and/or other network access) by the manufacturer to a central location to keep charge and maintenance records, reprogram the charger and/or update software/firmware, etc. Battery Sensors for batteries having networked chargers may make use of such an existing network, both to collect information from the charger and/or charger network, to provide information to the charger/charger network, and to utilize the existing communications mechanisms. The Battery Sensor may for example pass Battery-related information and measured values to an Intelligent Charger device or network, for use in tailoring the charger performance to best suit the battery voltage model and present age and condition, reducing energy usage and lowering energy costs while maximizing battery life. Optionally, the intelligent charger network may be configured to communicate with the Cloud Server to retrieve battery related configuration and record information for tailoring the charger performance. In this scenario, the Battery Sensor treats an intelligent charger network interface like an ID sensor mounted on the charger for its customary tracking feature. The charger can use this unique ID to retrieve battery-related data required for charging purposes. This maintains the unique firmware architecture on the Battery Sensor, with all configuration being carried out in the cloud rather than on the Battery Sensor itself, and allowing for common builds and firmware for the hardware installation without customization or configuration. In addition, the charger application module may be added to the Cloud Server for incorporating the charger network interface, which reduces service and integration issues. With this architecture, features may be added in the charger application module such as peak power limiting, load shedding, and others, which affect the operation of the charger based on data from the Battery Sensor.

Data Collector

The Data Collector 260 may be a rugged PC-class device or appliance with a processor and communications hardware compatible with the Battery Sensors 220. It may also have the capability to communicate to the Internet, using standard included network hardware, or via an additional cellular (or other) modem.

The Data Collector 260 requires no configuration. Once powered on, it automatically seeks a connection to the Cloud Server (or Cloud Application) 270, and also looks for any Battery Sensor(s) 220 in range. On any subsequent loss of power, it automatically restarts and again seeks the same connections.

The Data Collector 260 may also include some local troubleshooting capability. It may also be configured to execute a web server function locally, which can be connected to via a web browser to view and monitor the activity on the battery sensor network. The Data Collector 260 may also have a universally unique ID, which is used to identify the specific Data Collector 260 to the Cloud Sever 270 and the overall management system.

Data Collector Communications.

The Data Collector 260 may communicate with two primary endpoints or types of devices: Battery Sensor(s) 220 and Cloud Sever 270. The Data Collector 260 may also communicate directly with Identity Sensors 230A, 230B in some embodiments, at least for maintenance purposes such as firmware updates.

The Data Collector may implement the same protocol and commands as previously described in the specification in connection with the Battery Sensor 220 protocols and commands. Once data is retrieved from the Battery Sensor 220, and is confirmed to be received by the Cloud Sever 270, the "clear data" command can be sent by the Data Collector to reset the local Cache Memory of the Battery Sensor.

Since there could be many sensors in range of a particular Data Collector, it includes a verification, "collision" and communications strategy that collects data from each monitored device in a way that minimizes the possibility of data loss, while insuring timely updates to the Cloud Server.

Since more than one Data Collector may be at any given site, and battery sensors may be in range of one or more Data Collector 260, data may arrive at a Data Collector 260 that is already sent to and/or stored and processed by the Cloud Server 270. The Cloud Server may have or implement "collision" logic and determine whether it needs data for a particular device and issues the command to obtain this data from one or more Data Collector(s), even if they are sending data for the same Battery Sensor. Each Data Collector then collects and sends its data to the Cloud Server if requested.

If the Data Collector 260 determines or receives a communication from the Cloud Server 270 that data for a particular Battery Sensor 220 is already transferred and stored at the Cloud Server, for a given time period, then the Data Collector 260 may communicate with the Battery Sensor 220 and direct it to discard the data and reset its local Cache Memory.

Communications between the Data Collector 260 and the Cloud Server 270 may be via a secured HTTP link or through other proprietary or encrypted methods for Internet communications. While use of a special port is also covered by the present invention, it may have adverse effects due to firewall protection.

The Data Collector 260 forwards all collected Battery Sensor data to the Cloud Server 270, preferably appending its own unique ID to the transmitted data. The Cloud Server then retains a record of and stores in computer memory or external memory all Battery Sensor data, and is able to identify the specific Data Collector that transferred the data.

The Cloud Server 270 may also pass back to the Data Collector 260 status information about the Battery Sensor 220, for further transfer to the Battery Sensor. This feedback data may be used to provide feedback to a user on the Battery Sensor regarding the configuration status. While configuration of a Battery Sensor 220 is not required to collect data, it may be preferable that some configuration be performed on the Cloud Server 270 before useful operational and/or configuration data is reported to a user. The sensor LEDs on the Battery Sensor 220 can be used to provide visual feedback (for the user) regarding the status of that configuration and the monitored device.

Cloud Server

The Cloud Server (or Cloud Application) 270 stores all battery data, user configuration, authentication and accounting information. In addition, the application software on the Cloud Server actively processes the Battery-related data to provide users with actionable information regarding the Battery and/or other monitored equipment and/or devices (or assets) and assess its health, efficiency and need for maintenance and repair.

A number of reports, dashboards and/or graphics may be utilized to report the status to the users. The Cloud Server 270 configured to support sensor provisioning and data collection.

Battery and Identity Sensor Provisioning.

A Battery Sensor 220 may be connected to a Battery, and if a data collector is present, battery-related data will be sent to, received and recorded by the Cloud Server 270 (through the Data Collector 260). That data may be received and stored in raw form or format, meaning it would be difficult to provide users with battery health, efficiency or other operational or configuration information based on that information. In order for the Battery Sensors' data to be more functional and usable, it should be preferably associated with configuration data stored in the Cloud Server database, internal or external memory. The configuration data identifies the type and characteristics of the battery or monitored device (asset), plus user personalization information which may include things like an asset number of the battery, geographic location and other information.

A configuration for a Battery Sensor 220 may be defined by an authorized user, who may have specific knowledge and expertise in defining the configuration data and parameters. The sensor itself may carry a QR Code that uniquely identifies the sensor. By scanning the sensor QR Code and authenticating themselves, a user may enter the configuration data for the sensor into the Cloud Server via a web browser. Once entered, the Cloud Server 270 may report via cloud communications with the Data Collector 260 and Wireless Communication Network 297 with the Battery Sensor 220 that the configuration is complete. The sensor may then report this to the end user via a change in the LEDs on the sensor itself, on the attached ancillary equipment or device, and/or by communicating directly to a user smart device or other system.

Alternatively, for example, not all of identity Sensors, 230A and/or 230B in FIG. 2 may solely communicate directly with the Data Collector, but instead at least some may also be configured to communicate with the Cloud Server 270 albeit without going through the Data Collector 260 and Battery Sensor 220. The Identity Sensors may also carry a QR Code, which may be scanned locally with a smart device and transmitted from the smart device to the Cloud Server 270 via the Internet. Transmission of the QR Code may bring up a different configuration page on a web page hosted by the Cloud Server 270 for entry of configuration information. User authentication may be required prior to acceptance of configuration information. In some embodiments, Data Collector 260 may communicate directly with the Identity Sensors 230A, 230B for maintenance purposes, such as for firmware updates, and/or to transmit cloud configuration status for reporting via Identity Sensor LEDs. An Identity Sensor may be effective and operational even without any user configuration. Therefore, no feedback to the Identity Sensors 230A and 230B via the LEDs is required. However, it may be implemented in accordance with the system and method of the present invention.

Battery Sensor data may be delivered to the Cloud Server 270 via an onsite Data Collector 260 and via Cloud 195. If the Cloud Server has already received the Battery Sensor data for the transmitted data range, it may ignore the data and communicate to the Data Collector 260 that data is already there. If it accepts the transmitted data, it may confirm and communicate to the Data Collector 260 that the data is stored in the database. This informs the Battery Sensor 220 that it no longer needs to store the data in its local Cache Memory.

Cloud Server (Cloud Application).

The Cloud Server 270 may convert or summarize the raw Battery Sensor data into application-specific data, using the user configuration for the Battery Sensor. The converted or summarized data may provide the user with needed information about the efficiency, repair, maintenance and/or operability of each Battery Sensor and/or monitored device (asset). In the event that the user configuration information is incorrect, it is possible to redo it at a later time because raw data is stored on the Cloud Server in the database, or in the internal or external memory, operable and read by at least one processor.

Event Monitoring

Additional application software may also apply a set of tests on the data, looking for events where the data does not pass the set rules test. These events may be reported to an authorized user(s), via e.g. email, text messaging, and/or social networks such as Twitter® and Facebook®. Monitored events may include the following:

Low state of charge (under-charged)

Excess state of charge (over-charged, charger delivers too much energy)

Missed charge event

High Temperature

Low Temperature

Low Electrolyte level

High Throughput

Reporting (to User)

The Cloud Server 270 may also provide a range of reports for users. These may include at least the following data, summaries, reports and indicators:

Battery State of Charge

Throughput

Temperature
Voltage
Overview (includes the above)
Configuration User Interface.

Configuration of the system may be performed, at least in part, using HTML5- or Java-based web pages on the Cloud Server 270. The configuration pages may be provided for both traditional browsers on a computer or laptop, as well as for mobile devices, such as smart phones, tablets and others.

In addition, fleet reports may be provided to the end user, summarizing Battery data over a group of batteries or other devices that are monitored by the present system and method. The reports are preferably viewable via a web browser or as applications running on mobile user device(s). The reports may also be configured to be sent on a periodic frequency basis to the authorized users.

Battery Selection/Rotation

Figure 3:
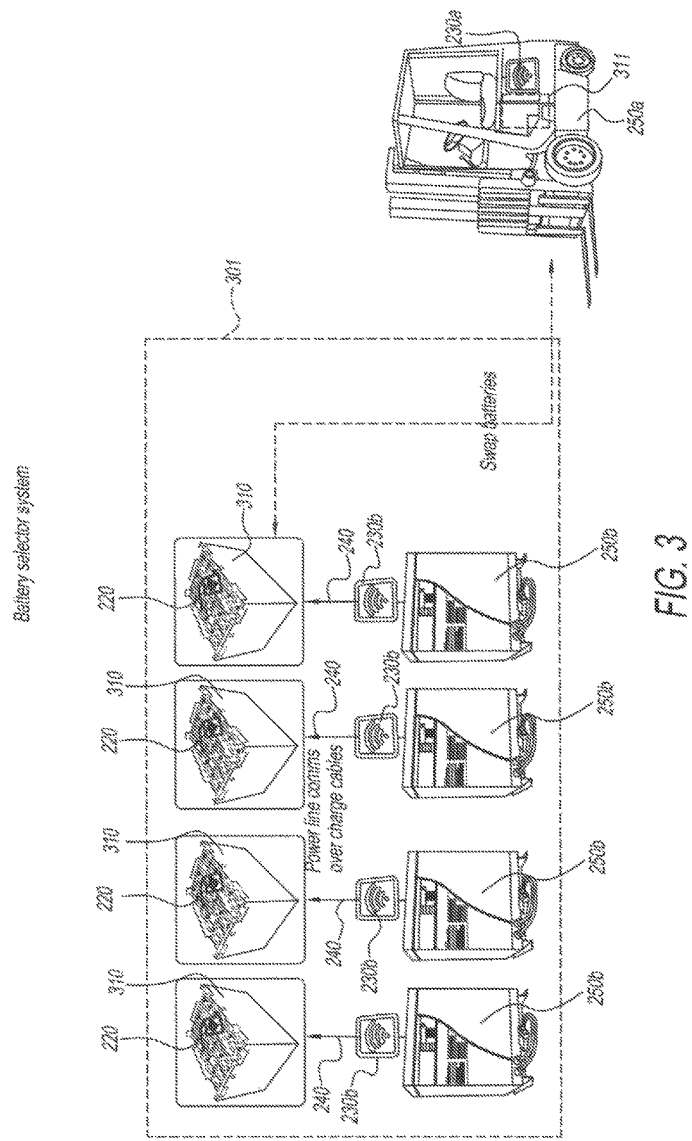
FIG. 3. illustrates a schematic diagram of a battery selection/rotation system and method in accordance with an embodiment of the present invention.

FIG. 3. illustrates a schematic diagram of a battery selection/rotation system and method in accordance with an embodiment of the present invention.

FIG. 3 illustrates a battery area 301, a room, in an industrial facility. Located in are 301 are a population of chargers 250B and a population of extra Batteries 310. For example, the industrial facility typically will have a greater number of Batteries 110 than the number of devices, e.g., vehicles 250A, that can use them, with the excess number of Batteries 110 (or, in other words, extra Batteries 310) being stored in area 301, where they can be charged and/or subjected to regular and routine maintenance. Typically, any Battery 310 in area 301 will be connected to a charger 250B. Batteries 310 may be in various states of recharging, e.g., some may have attained a state of being fully recharged while some are in the process of being recharged from a depleted charge level.

While FIG. 3 illustrates the same number of Batteries 310 and chargers 250B in area 301, other ratios of Batteries 310 to chargers 250B are contemplated. Similarly, while the size of the population of Batteries 310 in area 301 has been illustrated as four, such a population size was chosen merely for ease of illustration; other population sizes are contemplated. Battery Sensors 120 are affixed (and operatively connected) to Batteries 310, respectively.

FIG. 3 also illustrates a vehicle 250A, e.g., a forklift, traveling to area 310. For example, forklift 250 may have completed its work shift and/or the charge level of Battery 311 currently installed on forklift 250A has been depleted to a level for which it is prudent to exchange/rotate the depleted Battery 311 for a fresher corresponding one of Batteries 310 in area 301.

In the battery selection/rotation system, Battery Sensors 120 collect and store raw data as described above such that the system knows that unique IDs of the Batteries 310 are located in area 301. Each charger-Identity Sensor 230B exchanges its unique ID via the Power Line 240 with the corresponding Battery Sensor 120 such that the system also knows, among other things, that chargers 250B are located in area 301. In this way, the configuration can be stored via BDS Software for location tracking. It is noted that vehicle-Identify Sensor 230A can communicate its unique ID, e.g., wirelessly, for usage tracking, etc.

Any forklift in need of more energy, e.g., forklift 250A, will return to area 301 where depleted Battery 311 will be uninstalled (and subsequently recharged and/or subjected to maintenance in area 301) in exchange for a fresher corresponding one of extra Batteries 310 that will be installed on forklift 250A in replacement of depleted Battery 311.

In a fairly large industrial facility, it is typical to see as many, e.g., 50, instances of extra Battery 310, such that it can be difficult to keep track of which instance of Battery 301 is most ready to serve as the replacement, thereby complicating the selection process. In addition, there can also be different types of batteries (some of which may not have an electrochemical configuration sufficient to meet/source the voltage and current requirements of forklift 250A), thereby further complicating the selection process The battery selection/rotation system of FIG. 3 reduces, if not eliminates, the difficulty of the selection process.

For example, Cloud Server 170 may perform some, if not all, of the selection process. Via a user interface (not illustrated in FIG. 3) provided in area 301, Cloud Server 170 can indicate to a user (e.g., the person responsible for installing a replacement battery) which of Batteries 310 to select as the replacement for depleted Battery 311. Alternatively, Cloud Server 170 might indicate to the user a prioritized list of two or more of Batteries 311 as candidates for the replacement for depleted Battery 311. The selection may be based on a variety of factors, e.g., the adequacy with which the electrochemical configuration of a given Battery 310 can the voltage and current requirements of forklift 250A, the charge level of the given Battery 310 relative to its maximum level of charge (or, in other words, the level to which it is recharged), electrolyte levels of the given Battery 310, the temperature of the given Battery 310, the chronological age of the given Battery 310, the number service-cycles to which the given Battery 310 has been subjected, etc.

The present invention is not limited to the particular embodiments illustrated in the drawings and described above in detail. Those skilled in the art will recognize that other arrangements could be devised, for example, Examples. The present invention encompasses every possible combination of the various features of each embodiment disclosed. One or more of the elements described herein with respect to various embodiments can be implemented in a more separated or integrated manner than explicitly described, or even removed or rendered as inoperable in certain cases, as is useful in accordance with a particular application While the present invention has been described with reference to specific illustrative embodiments, modifications and variations of the present invention may be constructed without departing from the spirit and scope of the present invention as set forth in the following claims.

What is claimed is:

1. A battery sensor for attachment to and monitoring of any given one amongst a first population of interchangeable batteries, each battery being selectively connectable to any given one amongst a second population of interchangeable external devices, the system comprising:

one or more monitors configured to sense values of operational parameters of the given battery, respectively;

a memory to store at least an ID of the battery sensor;

a first interface configured to receive an ID from and of the given external device to which the given battery is connected; and a second interface configured to communicate, at least indirectly with the host over a communication path for which at least one segment thereof is a wireless segment:

the sensed parameter values;

the battery sensor ID; and the external device ID to a remote host.

2. The battery sensor of claim 1, wherein:
the second interface is further configured to receive from the host adaptive configuration data for the given external device; and
the first interface is further configured to generate adaptive data for the given external device based on the sensed parameter values and relations thereof with the given battery monitor ID and the given external device ID, respectively, and communicate the same to the given external device.

3. The battery sensor of claim 1, wherein:
the given external device is one of a charge sink and a charge source;
the first interface is further configured to communicate with the given external device using the same conduction path by which the given external device sinks or sources charge.

4. The battery sensor of claim 3, wherein:
as the charge sink, the given external device is an industrial vehicles for which at least one electric motor is the prime mover thereof; and
as the charge source, the given external device is charger.

5. The battery sensor of claim 1, wherein:
the second interface is further configured to communicate with the host at least indirectly via a data collector;
a communication link between the second interface and the data collector is the wireless segment of the communication path; and
the communication path includes at least one segment between the data collector and the host.

6. A system for monitoring a first population of interchangeable batteries, the system comprising:
a computational host remote from the first population of batteries; and
a second population of battery sensors, attachable to the first population of batteries and configured to monitor the same, respectively, each sensor including:
a first interface configured to communicate at least indirectly with the host over a communication path for which at least one segment thereof is a wireless segment;
the host including a second interface to communicate at least indirectly with the battery sensors;
the host being configured to receive, via the second interface, communications from the battery sensors, wherein a given communication from a given battery sensor includes an ID of the given battery sensor and sensed values of operational parameters of the given battery; and
the host being configured to quantitatively assess behavior as a whole of the first population of batteries based on the sensed values of the operational parameters and the IDs of the battery sensors corresponding thereto, respectively.

7. The system of claim 6, wherein:
the system further comprises:
a third population of interchangeable devices external to the batteries, any given device amongst the third population being selectively connectable to any given one of the batteries;
each first interface is configured to receive an ID from and of the given external device to which the given battery is connected; and
the given communication from the given battery sensor further including the ID of the given external device; and
the host being further configured to generate one or more quantitative assessments of behavior as a whole of the first population of batteries based on relationships of the IDs of the external devices to the batteries connected thereto and the corresponding sensed values of the operational parameters, respectively.

8. The system of claim 7, wherein:
the host is further configured to generate adaptive configuration data for the second population of interchangeable external devices based on the one or more quantitative assessments.

9. The system of claim 6, wherein:
the given external device is one of a charge sink and a charge source;
each first interface is further configured to communicate with the given external device using the same conduction path by which the given external device sinks or sources charge.

10. The system of claim 9, wherein:
as the charge sink, the given external device is an industrial vehicles for which at least one electric motor is the prime mover thereof; and
as the charge source, the given external device is charger.

11. The system of claim 6, wherein:
the system further comprises:
a third population of data collectors, each of the data collectors being configured to communicate with the host and with one or more of the battery sensors;
each first interface is further configured to communicate with the host at least indirectly via one of the data collectors such that a given data collector receives, from one or more of the battery sensors, the sensed values of the operational parameters and the corresponding battery sensor IDs, respectively;
a communication link between the first interface and the given data collector is the wireless segment of the communication path; and
the communication path includes at least one segment between the given data collector and the host.

12. The system of claim 11, wherein:
each data collector includes a memory to store at least an ID thereof; and
each data collector is further configured to the ID thereof to the host.

13. A system for monitoring a first population of interchangeable batteries, the system comprising:
a host remote from the first population of batteries;
a second population of battery sensors, attachable to the first population of batteries and configured to monitor the same, respectively; and
a third population of interchangeable devices external to the batteries, any given device amongst the third population being selectively connectable to any given one of the batteries;
each sensor including a first interface configured:
to communicate with the host at least indirectly over a communication path for which at least one segment thereof is a wireless segment; and
to receive an ID from and of the given external device to which the given battery is connected;
the host including a second interface to communicate at least indirectly with the batteries;
the host being configured to receive, via the second interface, communications from the battery sensors, wherein a given communication from a given battery sensor includes an ID of the given battery, sensed values of operational parameters of the given battery, and the ID of the given external device; and the host being further configured to generate adaptive data for the given external device based on the sensed parameter values and relations thereof with the given battery sensor ID and the given external device ID, respectively, and communicate the same to the given external device.

14. The system of claim 13, wherein:
the host is further configured to generate one or more quantitative assessments of behavior as a whole of the first population of batteries based on the sensed parameter values and relations thereof with the battery sensor IDs and the external device IDs, respectively.

15. The system of claim 13, wherein:
the given external device is one of a charge sink and a charge source;
each first interface is further configured to communicate with the given external device using the same conduction path by which the given external device sinks or sources charge.

16. The system of claim 15, wherein:
as the charge sink, the given external device is an industrial vehicles for which at least one electric motor is the prime mover thereof; and
as the charge source, the given external device is charger.

17. The system of claim 13, wherein:
the system further comprises:
a fourth population of data collectors, each of the data collectors being configured to communicate with the host and with one or more of the battery sensors;
each first interface is further configured to communicate with the host at least indirectly via one of the data collectors such that a given data collector receives, from one or more of the battery sensors, the sensed values of the operational parameters and the corresponding battery sensor IDs, respectively;
a communication link between the first interface and the given data collector is the wireless segment of the communication path; and
the communication path includes at least one segment between the given data collector and the host.

18. The system of claim 17, wherein:
each data collector includes a memory to store at least an ID thereof; and
each data collector is further configured to the ID thereof to the host.

19. A system for monitoring operation of a plurality of data sensors, the system comprising:
at least one data sensor attached to a battery and configured to receive operational data from the battery, wherein the at least one data sensor includes:
a local memory for temporary storage of the operational data received from the at least one battery attached to the data sensor;
a power line communication module on the at least one data sensor; and
a wireless communication module configured to communication with and transit data from the local memory;
at least one data collector, configured to wirelessly communicate with and receive data from the at least one data sensor, wherein the data collector includes:
a cloud communication module configured to transmit data received from the at least one data sensor; and
a cloud server, having a processor and memory, configured to receive and process data from the at least one data collector;
wherein the cloud server is further configured:
to store the data from the at least one data collector in raw form;
to separately receive and store configuration data; and
to apply the configuration data to the data received from the at least one data collector to generate application data.

* * * * *